United States Patent

Kolodinski et al.

Patent Number: 5,693,151
Date of Patent: Dec. 2, 1997

[54] PHOTOVOLTAIC DEVICE

[75] Inventors: Sabine Kolodinski, Dresden; Jürgen H. Werner; Hans J. Queisser, both of Stuttgart, all of Germany

[73] Assignee: Max-Planck-Gesellschaft zur Förderung der Wissenschaften E.V., Munich, Germany

[21] Appl. No.: 648,153

[22] PCT Filed: Nov. 23, 1994

[86] PCT No.: PCT/EP94/03876

§ 371 Date: May 23, 1996

§ 102(e) Date: May 23, 1996

[87] PCT Pub. No.: WO95/15011

PCT Pub. Date: Jun. 1, 1995

[30] Foreign Application Priority Data

Nov. 25, 1993 [DE] Germany ............... 43 40 221.6

[51] Int. Cl.$^6$ ............................................. H01L 31/04
[52] U.S. Cl. ............... 136/255; 136/261; 257/431; 257/438; 257/461
[58] Field of Search ............... 136/252, 255, 136/261; 257/431, 438, 461

[56] References Cited

FOREIGN PATENT DOCUMENTS

A55-075 278  6/1980  Japan .

OTHER PUBLICATIONS

"Journal of Applied Physics", vol. 74, No. 2, Jul. 15, 1993 New York, pp. 1451–1452; P.T. Landsberg et al, Band–impact ionization and solar cell efficiency.

"Applied Physics Letters", vol. 63, No. 17, Oct. 25, 1993 New York, pp. 2405–2407, S. Kolodinski et al, Quantum efficiencies exceeding unity due to impact ionization . . . .

"Solar Cells", vol. 25, No. 2, Nov. 1988, Lausanne, Switzerland pp. 163–168, J.R. Sites, Calculation of impact ionization enhanced photovoltaic efficiency.

"Solar Energy Materials and Solar Cells", vol. 28, No. 3, Dec. 1992, Amsterdam, Netherlands, pp. 273–284, S.A. Healy, Efficiency enhancements . . . .

"Tenth E.C. Photovoltaic Solar Energy Conference", Apr. 8, 1991, Lisbon, Portugal, pp. 73–74, S.E. Healy et al, Enhancement of sub–bandgap absorption in X–Si . . . .

"Solar Energy Materials and Solar Cells", vol. 33, No. 3, Jul. 1994, Amsterdam, Netherlands, pp. 275–285, S. Kolodinski et al, Quantum efficiencies exceeding . . . .

"Physical Review Letters", vol. 72, No. 24, Jun. 13, 1994 New York, pp. 3851–3854, J.H. Werner et al, Novel optimization principles and efficiency limits for semiconductor solar cells.

"Phys. Rev. B.", vol. 41, 1990, p. 5919 et seq.

*Primary Examiner*—Aaron Weisstuch
*Attorney, Agent, or Firm*—Frishauf, Holtz, Goodman, Langer & Chick, P.C.

[57] ABSTRACT

A photovoltaic means, e.g. a solar cell in which mobile charge carriers are generable by incident optical radiation contains a semiconductor body of a material having such an energy band structure that in the spectral range of the incident radiation an additional carrier generation is made possible by impact ionization (Auger effect). As a result, the internal quantum efficiency may be increased above the value 1. The semiconductor material may consist of germanium and silicon, particularly GeSi.

9 Claims, 5 Drawing Sheets

5,693,151

PHOTOVOLTAIC DEVICE

FIELD OF THE INVENTION

This application relates to photovoltaic devices specifically adapted for conversion of visible radiation energy, for example for solar cells.

BACKGROUND

The efficiency of the photovoltaic conversion of energy is of decisive significance for the practical application of photovoltaic means. In such classical photovoltaic means as solar cells the generation quantum efficiency (GQE), i.e. the number of electron/hole pairs generated per quantum of radiation, maximally equals 1, thus resulting in the measurable internal quantum efficiency (IQE) also being maximally equal to 1. It has hitherto been assumed that the value 1 cannot be exceeded and that the proportion of photon energy depending on the band gap of the semiconductor and exceeding the energy necessary for generating an electron hole pair is lost as heat.

SUMMARY OF THE INVENTION

It is an object of the invention to provide a device which uses the proportion of radiation quantum energy exceeding the band gap energy in a photovoltaic semiconductor means, particularly to provide improved and efficient solar cells.

Briefly, according to the invention, the photovoltaic device contains a semiconductor material having such a band structure that an additional internal generation of carrier pairs is able to take place by optical impact ionization, that is, by Auger generation or carrier generation by the Auger effect.

A preferred semiconductor material is germanium and silicon, e.g. GeSi.

As a result of additional charge carriers being generated by impact ionization, the internal quantum efficiency of the carrier generation can be made to exceed the value 1.

For photon energies exceeding twice the fundamental energy gap $E_G$ of the semiconductor of the photovoltaic means, an internal quantum efficiency IQE=2 and more is possible by impact ionization (Auger generation).

BRIEF DESCRIPTION OF THE DRAWINGS

The invention will now be explained in more detail, whereby further features and advantages of the invention will become evident, with reference to the drawings, in which.

DETAILED DESCRIPTION.

Figure 1:
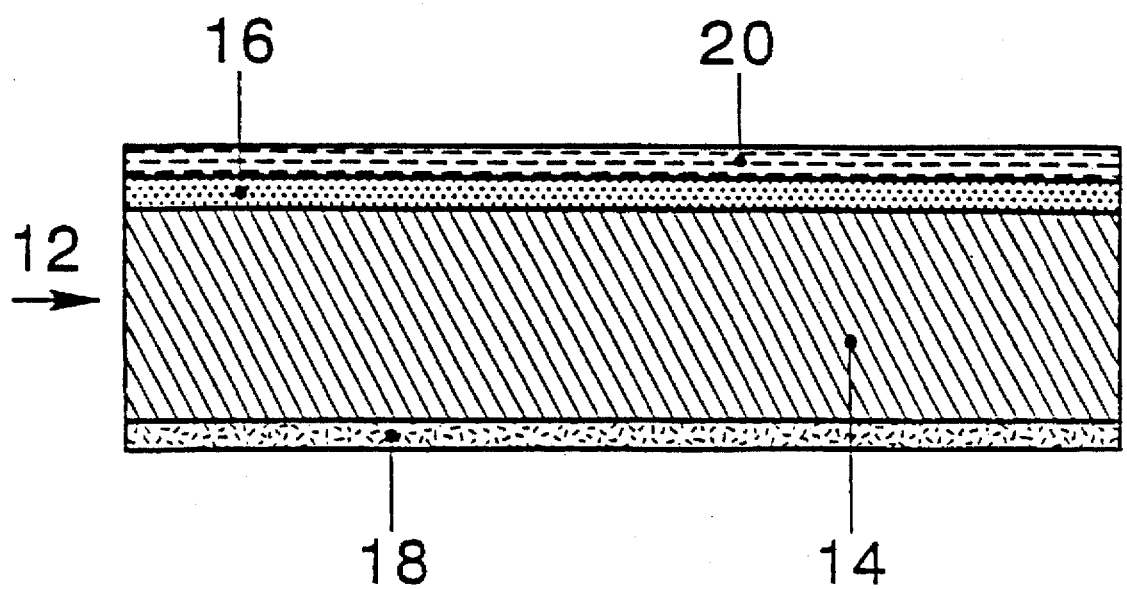
FIG. 1 is a schematic sectional view of a photovoltaic means in the form of a solar cell in which the invention may find application.

FIG. 1 shows, greatly simplified, the structure of a typical solar cell in section. The solar cell 10 represented as a typical example includes a wafer-like monocrystalline semiconductor body 12 of silicon or preferably of GeSi comprising an e.g. 280 μm thick [100]-oriented, p-conducting main part 14 and an e.g. 0.4 μm thick phosphorous-doped zone 16. The main part 14 is arranged on a substrate electrode 18, and on the surface zone 16 a transparent or structured electrode (not shown) and an e.g. 100 nm thick, thermally generated protective layer of $SiO_2$ 20 are provided.

Figure 2:
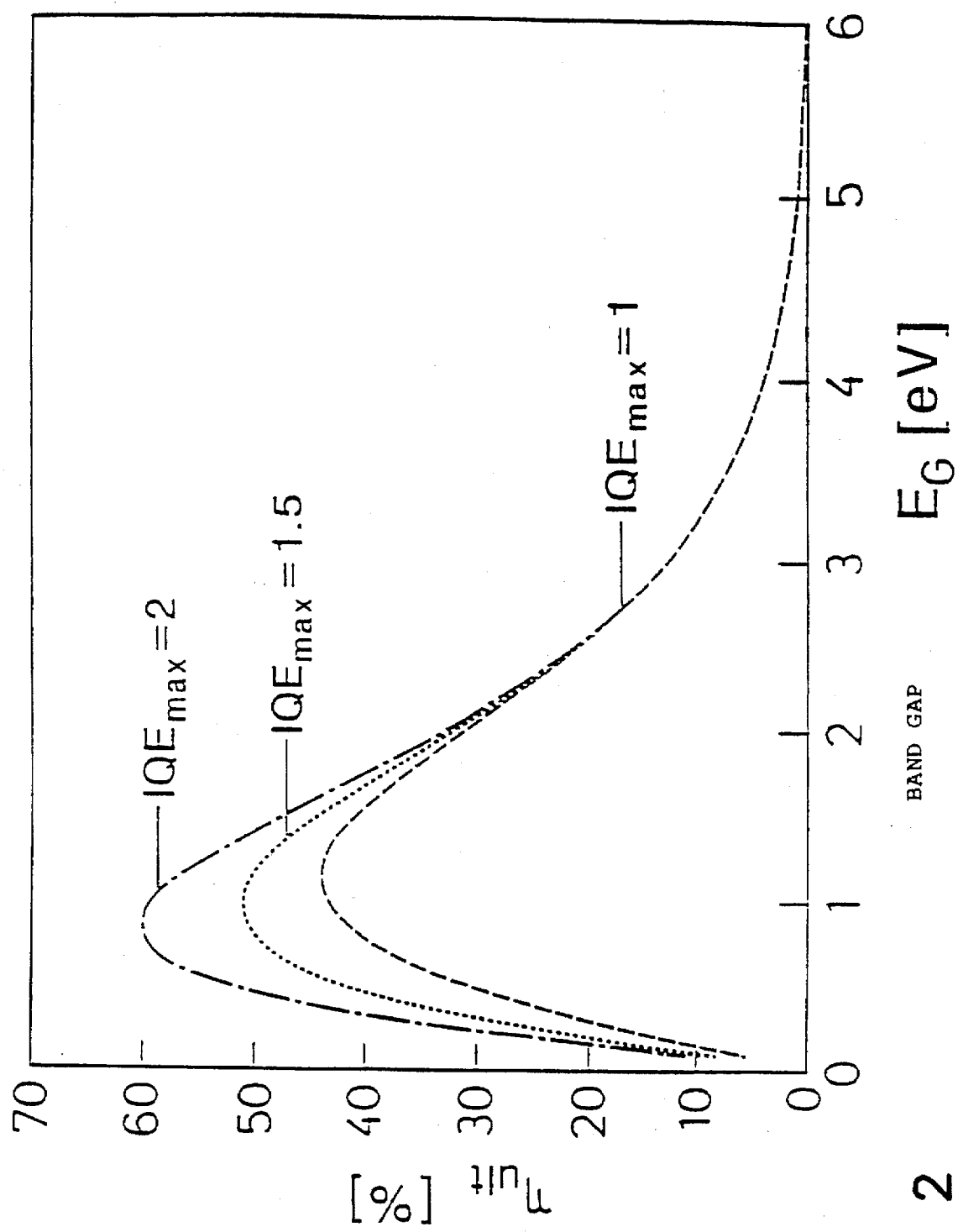
FIG. 2 plots the ultimate (theoretically maximum) efficiency $n_{ult}$ as a percentage dependent on the fundamental gap energy $E_G$ in eV assuming an illumination by radiation having the spectrum of a black radiator.

FIG. 2 shows the maximum possible efficiency of solar cell 10 as a function of band gap energy for the illumination spectrum of a black body having a temperature of 6000 K for a maximum internal quantum efficiency $IQE_{max}=1$ for $h\nu \geq E_G$, furthermore for $IQE_{max}=1.5$ for $h\nu \geq 2E_G$ and for $IQE_{max}=2$ for $h\nu \geq 2E_G$. For the last case, the primary band gap as an optimum for the photovoltaic energy conversion shifts from approx. 1 eV to values below 1 eV whilst at the same time the maximum possible efficiency of 44.7% for the case $IQE_{max}=1$ increases to 60% for $IQE_{max}=2$. Semiconductor materials in which effective additional charge carriers are generated by the Auger effect (impact ionization), by making better use of the energies of irradiated photons, may thus result in considerable increases in the efficiency of photocell.

Figure 3:
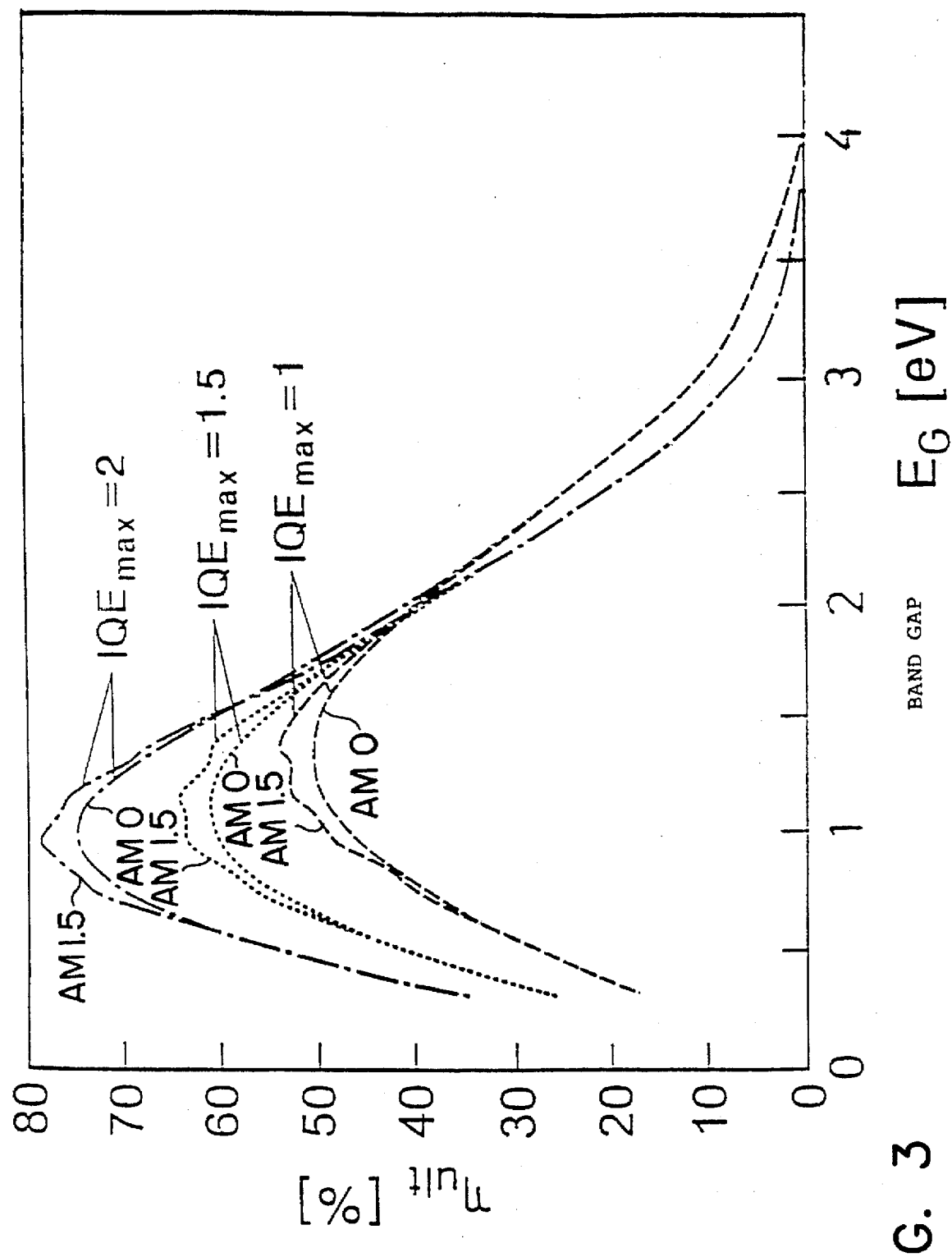
FIG. 3 plots the ultimate efficiency $n_{ult}$ for the AM0 spectrum (smooth curves) and the AM1.5G spectrum (curves having several relative maxima)

FIG. 3 shows the maximum possible efficiency as a function of band gap energy for the AM0 spectrum (total intensity 1350 W/m$^2$) and the AM1.5 spectrum (total intensity 1000 W/m$^2$) assuming IQE=1 (no Auger generation) and $IQE_{max}=1.5$ as well as $IQE_{max}=2$ assuming Auger generation.

The maximum value of the ultimate efficiency for the AM0 spectrum shifts to smaller energies of the energy gap when taking into account the Auger generation, the optimum band gap for this spectrum amounting to 1.35 eV for $IQE_{max}=1$. With Auger generation (assuming $IQE_{max}=1.5$) the optimum band gap shifts to 1.2 eV or for even more effective Auger generation (assuming $IQE_{max}=2$) to even 0.9 eV. Also, the two relative maxima of the ultimate efficiency for the AM1.5 spectrum shift in a similar way, their still being of the order 1.4 eV and 1.1 eV assuming $IQE_{max}=1$, but shift to 0.9 eV and 1.1 eV (assuming $IQE_{max}=1.5$) or to 0.8 eV and 0.9 eV for $IQE_{max}=2$ when taking Auger generation into account. At the same time, the relative maxima are reduced in the curves relating to the AM1.5 spectrum, the creation of which is caused by the sharp breaks in the IR range of the AM1.5G spectrum due to $H_2O$ and $CO_2$ absorption lines. This behavior is also attributable to the better use made of the energy of each photon by Auger generation.

For a radiation quantum energy equivalent to twice the band gap (IQE=2) the ultimate efficiency with Auger generation is increased by a factor of almost 1.5. A material in which an Auger generation, i.e. impact ionization is possible, is thus superior by a factor of almost 1.5 to a material having the same energy gap but having no possibility of Auger generation.

In practice, the aforementioned ultimate efficiencies are reduced by recombination processes such as e.g. radiative recombination and Auger recombination. For the indirect semiconductor silicon it has been found that it is not the radiative recombination but the Auger recombination which is the process determining the limit of the no-load voltage of the photovoltaic means.

By exploiting Auger generation, i.e. the additional generation of carrier pairs, the theoretical maximum achievable efficiency for the spectrum of the black body may be enhanced from 44% to 60%. At the same time, the maxima of the ultimate efficiency, i.e. the optimum band gap for a photovoltaic means designed for the spectrum of the black body, are shifted to lower energies for the AM0 spectrum and the AM1.5 spectrum. It is thus not values of 1.1 eV (Si) and 1.4 eV (GaAs) which provide the best conditions for the photoconversion with radiation in the AM1.5 spectrum but semiconductor materials having smaller energy band gaps when exploiting Auger generation. The shift in the optimum band gap towards lower energies becomes all the more pronounced, the more effective the Auger generation and, accordingly, also the exploitation of the energy of each photon is.

The conditions for an optimum band structure of a semiconductor material for photovoltaic means such as solar cells, taking Auger generation into account (impact ionization, internal photoeffect) making it possible to achieve high quantum efficiencies of IQE>1 over a broad range of the solar spectrum will now be explained in the following.

Figure 4:
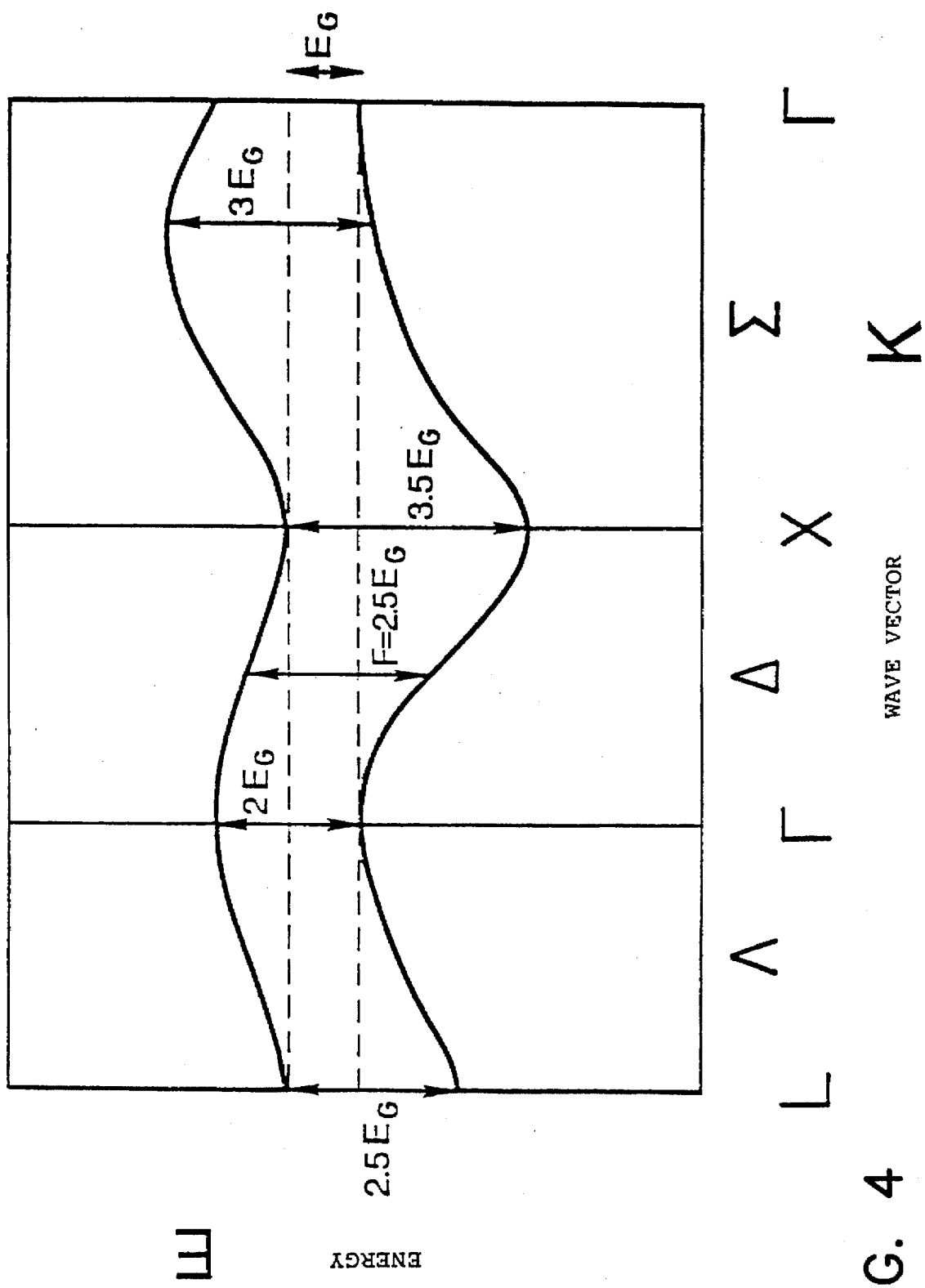
FIG. 4 is an example of a band structure E(k) with which a quantum efficiency of more than 1 may be achieved by Auger generation with radiation quantum starting energy of 2 $E_G$.

The conditions for an energetic wideband-effective impact ionization in the semiconductor material, of which as many as possible are to be achieved, are:

a) The semiconductor should have both a lowest indirect band gap and also as many direct band gaps as possible, which should be greater than the indirect band gap.

b) Employing impact ionization (Auger generation) for generating pairs of charge carriers should be done at low energies where possible.

c) The excess energy $E_x = h\nu - E_G$ should ideally always be to the benfit of only a single charge carrier of the pair of charge carriers generated primarily (principle of unequal distribution of excess energies).

d) Points in the band structure offering the primary charge carrier, i.e. electron or hole favorable possibilities of triggering secondary pairs of charge carriers by Auger generation should be promoted by strong absorption of light (zones L, Γ, X in FIG. 4). As compared to this, points in the band structure having unfavorable conditions for Auger generation (zone F in FIG. 4) should be activated only weakly or should be energetically degenerated with points of a high impact probability (zone L in FIG. 4).

e) Optical transitions leading to favorable starting positions for Auger generation should adjoin each other energetically as of the starting energy and cover the solar spectrum as wideband as possible.

These criteria can be rendered more concrete by the requirements on the band structure as given below. In this respect the condition a) results in restriction to the highest valence band $E_v$ and the lowest conduction band $E_c$ of an indirect semiconductor. Parameters important to this consideration are the energetic differences of a charge carrier in the E($\underline{k}$) profile to the band extremum in each case, wherein the k-dependent valence band difference $\Delta E_v(\underline{k})$ being the difference between the valence band maximum and the valence band for each wave vector $\underline{k}$ in accordance with $\Delta E_v(\underline{k}) = E_{v,max} - E_v(\underline{k})$. The k-dependent conduction band difference $E_c(\underline{k})$ is the difference between conduction band and conduction band minimum $E_{c,min}$ for each wave vector $\underline{k}$ in accordance with $\Delta E_c(\underline{k}) = E_c(\underline{k}) - E_{c,min}$.

Generating two electron/hole pairs necessitates a photon energy of at least twice the energy of the fundamental (indirect) band gap and represents the minimum starting energy for Auger generation. If a direct transition exists in this photon energy then a strong optical transition is present.

Requirement 1: (Starting energy of Auger generation) The first direct band gap $E_{D1}$ amounts to at least twice the fundamental (indirect) band gap $E_G$ according to $$E_{D1} = 2E_G. \tag{1}$$

Auger generation commences when $E_{D1}$ in addition to either the conduction band difference or the valence band difference becomes zero in accordance with $$\Delta E_v = 0 \text{ or } \Delta E_c = 0, \tag{2}$$

so that either the electron or the hole alone takes over the excess energy in its entirety. In this way no portion of the photon energy is lost, the energy in its entirety being used in generating electron/hole pairs.

At as many loci of the Brillouin zone as possible high values of $\Delta E_c$ should correspond with low values of $\Delta E_v$ and vice-versa. The excess energy $E_x = h\nu - E_G$ should always be released where possible totally to either the electron or the hole of the resulting charge carrier pair to satisfy the minimum energy requirement of Auger generation at many points.

Requirement 2: (Minimum energies of Auger generation) The k-dependent energy differences in the conduction band attain maximum values when the energy differences in the valence band are a minimum or equal zero and vice-versa. These are just the properties of an indirect semiconductor. Minimum values of band differences leading to impact ionization are $$\Delta E_c > E_G, \text{ when } \Delta E_v = 0, \text{ and} \tag{3}$$

$$\Delta E_v > E_G, \text{ when } \Delta E_c = 0 \tag{4}$$

applies.

At loci at which neither the conduction band nor the valence band difference $\Delta E_c$, $\Delta E_v$ equals zero, the minimum band gap in this case amounts to $$\Delta E(\underline{k}) = E_c(\underline{k}) - E_v(\underline{k}) = 2E_G + 2\Delta E_v, \text{ for } \Delta E_v \neq 0 \text{ and} \tag{5}$$

$$\Delta E(\underline{k}) = E_c(\underline{k}) - E_v(\underline{k}) = 2E_G + 2\Delta E_c \neq 0 \tag{6}$$

Requirement 3: (Effective points of Auger generation)

Points at which one of the minimum band gaps of the equations (2)–(6) is exceeded should be excited by strong optical transitions. This is the case when these are located at points of high symmetry or the local curvature of valence band $dE_v/d|\underline{k}|$ and conduction band $dE_c/d|\underline{k}|$ is the same.

For points having $$\Delta E_v \geq E_G \gg \Delta E_C \text{ or} \tag{7}$$

$$\Delta E_C \geq E_G \gg \Delta E_V \tag{8}$$

$$\frac{dE_C}{d|\underline{k}|} = \frac{dE_v}{d|\underline{k}|} \tag{9}$$

should apply.

Loci which due to an equipartition of the excess energy $\Delta E_c(k) \approx \Delta E_v(k)$ are unfavorable for Auger generation and all loci not satisfying the minimum requirements on the band differences stemming from requirement 2 should not be located at points of high symmetry but along the axes. The curvature of conduction band and valence band should be different where possible so that here the absorption is only weak.

For points having $$\Delta E_V \approx \Delta E_C < E_G \tag{10}$$

$$\frac{dE_C}{d|\underline{k}|} \neq \frac{dE_V}{d|\underline{k}|} \tag{11}$$

should apply.

If, in addition to this, the band curvature at the band extremum is slight, according to $$\frac{dE_C}{d|k|}\bigg|_{E_{c,min}} \approx 0 \quad (12)$$

$$\frac{dE_V}{d|k|}\bigg|_{E_{v,max}} \approx 0 \quad (13)$$

there are numerous possibilities for the hot charge carriers in the band extremum to relax by the Auger effect and to generate additional charge carriers. Strong optical transitions for simultaneously strong (but equal) dispersion of both bands also result in high impact ionization probabilities if the dispersion in the band extremum is slight.

Requirement 4: (Distribution of effective points of Auger generation over the solar spectrum)

Direct transitions having large band differences which satisfy the minimum energies of requirement 2 and which are occupied by strong optical transitions in accordance with equation (9) adjoin each other energetically and cover the solar spectrum over a wide band, in accordance with $$2E_G = E_{D1} < E_{D2} < E_{D3} < E_{D4} \ldots \leq h\nu_{max} \quad (14)$$

The maximum photon energy $h\nu_{max}$ amounts to 4 eV for the AM1.5G spectrum and about 10 eV for the AM0 spectrum.

FIG. 4 is an example of a semiconductor band structure with which the quantum efficiency above the value 1 may be achieved by Auger generation for a starting energy of $2E_G$. For a photon energy of $2E_G$ there are numerous direct transitions which result in favorable starting positions for Auger generation from either the primary generated electron or hole.

FIG. 4 shows the band structure of a hypothetical semiconductor which satisfies the above principles ideally: an indirect semiconductor having the fundamental energy gap $E_G$ (from $\Gamma$ to X) and having the first direct transition at $2E_G$ (at the $\Gamma$ point). There are adjoining direct transitions of $2.5E_G$ (at L and $3.5E_G$ (at X) as well as $3E_G$ (along the $\Sigma$ axis). The transitions at X and L lead to hot holes, those at $\Gamma$ and along the $\Sigma$ axis lead to hot electrons. The charge carriers have sufficient excess energy at these points to relax to the band extrema. The point F along the $\Delta$ axis having an unfavorable distribution of excess energies (neither $E_c$ nor $\Delta E_v$ exceeds the indirect band gap $E_G$) is energetically degenerated with the transition at the L point which results in a highly favorable distribution of the excess energies to electron and hole.

With the aim that the gain in current being possible by Auger generation cannot be compensated by a loss in the voltage as a result of an also promoted Auger recombination, the end points of the Auger generation (these being of course at the same time the starting points of Auger recombination) should not be located at the absolute extreme of the band but instead should be somewhat removed therefrom. This results in the starting points of the recombination under $V_{oc}$ conditions not being occupied and thus no Auger recombination can take place.

To be able to make use of the advantages of impact ionization, other possibilities of the energy loss of hot charge carriers must be rendered ineffective where possible. The interaction with phonons should be as weak as possible, i.e. the bond relationships should be unpolar where possible. The energy addressed to other charge carriers by the interaction between charge carrier/charge carrier interaction may be influenced by the doping.

The optimum band structure is characterized by strong optical transitions over a broad range. They result in a high extinction coefficient k and thus in small optical penetration depths. Small optical penetration depths necessitate good possibilities of surface passivation so that the charge carriers generated in the vicinity of the surface do not instantly recombine. This strong absorption also results in a high reflection of the semiconductor. To achieve effective use by the additionally generated charge carriers the reflection would have to be reduced by suitable antireflection coatings or, otherwise, by providing multiple absorption chances for reflected light rays as a result of non-planar surfaces (light traps).

Accordingly, the properties of the band structure of a semiconductor capable of permitting Auger generation and thus quantum efficiencies greater than the value 1 at low recombination are:

- pronounced parallelism of the uppermost conduction band and the lowermost valence band;
- generally, a strong dispersion with conduction band and valence band differences which exceed the fundamental band gap;
- locally weak and similar dispersion in valence band and conduction band in the vicinity of the points of symmetry and in the vicinity of the band extrema;
- the starting energy of Auger generation at an optimum, because of it being as low as possible, is $E_{D1}=2E_G$ (for $\Delta E_v=0$ or $\Delta E_c=0$);
- points having good possibilities of Auger generation adjoin each other energetically.

These requirements as to the band structure are either in keeping with other requirements on solar cells (e.g. high minority carrier lifetimes) or, if in contradiction with the latter, can be recompensated by methods already available (e.g. antireflection coatings).

Figure 5:
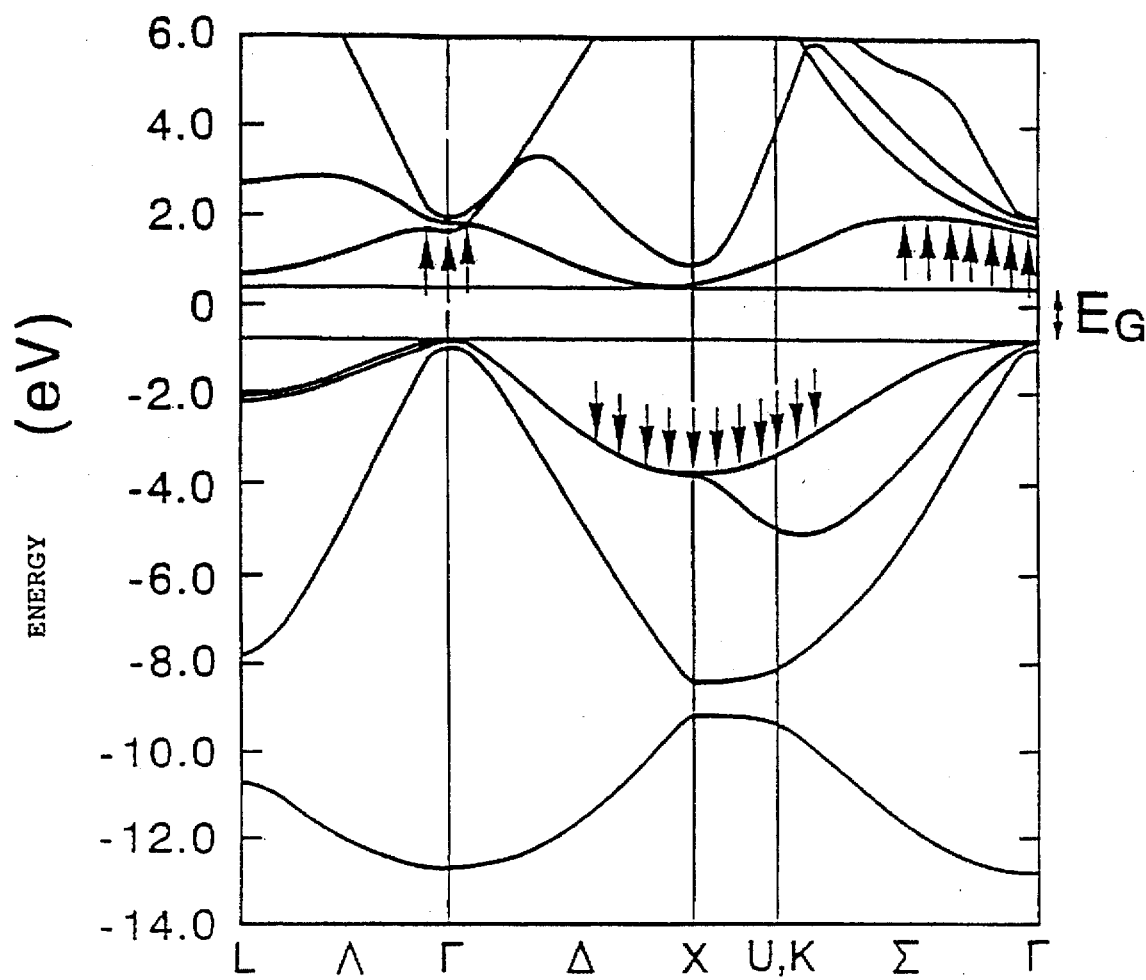
FIG. 5 graphically represents the band structure of the zinc blende type semiconductor material GeSi.

A semiconductor well satisfying the requirements as given above is the zinc blende-type semiconductor GeSi. FIG. 5 shows the band structure of this semiconductor calculated by Schmid et al. (U. Schmid, N. E. Christensen and M. Cardona, Phys. Rev. Vol. 41, 5919 (1990)). Favorable points for Auger generation are indicated by arrows. GeSi is an indirect semiconductor having a energy gap of 1.2 eV between $X_6$ and $\Gamma_8$. The pronounced parallelism of the lowermost conduction band and the uppermost valence band is remarkable, which feature is similar to the case of silicon and being favorable for impact ionization. One major advantage afforded by GeSi as compared to Si is the energy of the first direct transition at the $\Gamma$ point which at 2.4 eV as compared to 3.4 eV for Si relates substantially more favorably to the solar spectrum and satisfies especially the minimum energy condition. Starting of Auger generation is thus shifted to the lowest possible energy for a given fundamental energy gap. The end point of impact ionization starting from the $\Gamma$ point is the X point. In its vicinity the dispersion of the conduction band in the $\Delta$ direction is merely weak, this making numerous impact ionization transitions possible which should result in a high impact ionization probability.

The valence band difference at L also exceeds $E_G$, however, requirement 5), which in this case is more stringent for the non-disappearing conduction band difference, cannot be satisfied, impact ionization within the first conduction and valence band thus not being possible starting from L. Along the $\Sigma$ axis there is also a region at the $\Gamma$ point which satisfies the energy condition $\Delta E_c > E_G$. Only parts of these points (in the vicinity of $\Gamma$) result in numerous impact ionization transitions. The reason for this is the stronger dispersion at the end point of impact ionization (i.e. at the X point in the $\Sigma$ direction) which results in a reduction of the possibilities for impact ionization. In the vicinity of the X point an extensive region satisfies the requirement 4). The low dispersion of the valence band at the Γ point in both the Δ and Σ direction permits numerous impact ionization transitions and should result in a high impact ionization probability for holes excited at these points. Direct transitions exist at Γ and along the Σ axis in the vicinity of Γ which result in high impact ionization probabilities of hot electrons, as well as direct transitions exist at X and near thereto along the Δ and Σ axis which result in high impact ionization probabilities of hot holes. These direct transitions adjoin each other energetically and thus cause good impact ionization efficiencies in a broad energy interval as of the starting energy of the first direct band gap of 2.4 eV.

As a zinc blende semiconductor, GeSi has less symmetry than silicon, which in general results in less degeneration of the energy bands. If this greater degeneration of the energy bands causes the direct optical transitions to be somewhat weakened as compared to those in silicon, this would make demands on the surface passivation which are not so high as is the case of Si. Nevertheless, the hitherto difficult passivation of the GeSi surface for making use of Auger generation in a possible GeSi solar cell remains the prime technological task needing to be satisfied.

In an experiment with 0.92 eV (R. Braunstein, A. Moore and F. Herman, Phys. Rev. 109, 685 (1958)) the value of the energy gap turns out to be less than the value calculated by Schmid. The value determined experimentally is in good agreement with the optimum band gap assuming Auger generation.

This band gap can be further optimized by varying the Ge/Si ratio.

As a photoconductive layer a stressed SiGe layer may also be used, wherein compressive and tensile stresses can be incorporated in the layer. Incorporating stresses in this way can be done by epitaxying the SiGe layer on substrates having smaller lattice constants (e.g. Si) or greater lattice constants (e.g. Ge) to thus reduce or increase respectively the lattice constant of the SiGe layer with respect to the non-stressed layer.

The invention is applicable to the many and varied photovoltaic means e.g. barrier-layer photocells, Schottky contact photocells, means incorporating heterostructured semiconductor bodies, and the like.

We claim:

1. A photovoltaic device with a semiconductor body in which mobile charge carriers are generatable by incident optical radiation, said semiconductor body containing a monocrystalline material with an energy band having both a fundamental indirect band gap $E_G$ and at least one larger direct band gap being located at a specific point in the Brillouin zone of the material, said Brillouin zone being the unit cell of the reciprocal lattice of the crystalline material, wherein at least one direct band gap has an energetic difference corresponding to the visible range of electromagnetic radiation and is twice as large as said indirect band gap, and for said specific point in the Brillouin zone either relationship $\Delta E_v = 0$ or $\Delta E_c = 0$, is valid, wherein $\Delta E_v$ is the energetic difference between the valence band at said specific point and the valence band maximum, and $\Delta E_c$ is the energetic difference between the conduction band at said specific point and the conduction band minium.

2. The device as set forth in claim 1, characterized in that at at least one further locus in the Brillouin zone of a material a larger value of $\Delta E_c$ corresponds to a smaller value of $\Delta E_v$ and that $\Delta E_c \geq E_G$, when $\Delta E_v = 0$ and $\Delta E_v \geq E_G$, when $\Delta E_c = 0$.

3. The device as set forth in claim 2, characterized in that at loci in the Brillouin zone of the material at which neither $\Delta E_c$ nor $\Delta E_v$ equals zero the minimum band gap $\Delta E(\underline{k})$ amounts to:

$\Delta E(\underline{k}) = E_c(\underline{k}) - E_v(\underline{k}) = 2E_G + 2\Delta E_v$, for $\Delta E_v \neq 0$ and $\Delta E(\underline{k}) = E_c(\underline{k}) - E_v(\underline{k}) = 2E_G + 2\Delta E_c$, for $\Delta E_c \neq 0$.

4. The device as set forth in claim 2, characterized in that said loci in the Brillouin zone of the material at which $\Delta E_v = \Delta E_c < E_G$ applies, are not located at points of high symmetry, or that at these loci $dE_v/dlkl$ is substantially unequal to $dE_c/dlkl$.

5. The device as set forth in claim 1, characterized in that said direct band gaps and/or the loci satisfying the further conditions are located at points of high symmetry or in that at these $dE_v/dlkl$ substantially equals $dE_c/dlkl$.

6. The device as set forth in claim 1, characterized in that said semiconductor material comprises several direct band gaps substantially adjoining to each other.

7. The device as set forth in claim 1, wherein said semiconductor material comprises germanium and silicon.

8. The device as set forth in claim 1, characterized in that said semiconductor material consists of germanium and silicon.

9. The device as set forth in claim 1, characterized in that said semiconductor material consists of SiGe.

* * * * *